(12) United States Patent
Miura et al.

(10) Patent No.: US 10,032,736 B2
(45) Date of Patent: Jul. 24, 2018

(54) SEMICONDUCTOR DEVICE

(71) Applicant: RENESAS ELECTRONICS CORPORATION, Kawasaki-shi, Kanagawa (JP)

(72) Inventors: Yoshinao Miura, Kawasaki (JP); Takashi Nakamura, Kawasaki (JP); Tadatoshi Danno, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 124 days.

(21) Appl. No.: 14/494,409

(22) Filed: Sep. 23, 2014

(65) Prior Publication Data

US 2015/0084135 A1    Mar. 26, 2015

(30) Foreign Application Priority Data

Sep. 24, 2013 (JP) .................. 2013-196874

(51) Int. Cl.
*H01L 23/538* (2006.01)
*H01L 23/00* (2006.01)
(Continued)

(52) U.S. Cl.
CPC .......... *H01L 24/09* (2013.01); *H01L 23/4824* (2013.01); *H01L 23/4952* (2013.01);
(Continued)

(58) Field of Classification Search
CPC .......... H01L 23/49562; H01L 23/4952; H01L 23/4824; H01L 24/05; H01L 24/06;
(Continued)

(56) References Cited

U.S. PATENT DOCUMENTS 6,222,210 B1 * 4/2001 Cerny ................. H01L 21/8252
257/194
6,900,482 B2    5/2005 Aoki et al.
(Continued)

FOREIGN PATENT DOCUMENTS

CN           103229284 A      7/2013
JP          H01-268038 A     10/1989
(Continued)

OTHER PUBLICATIONS

Notice of Reasons for Rejection issued in corresponding Japanese Patent Application No. 2013-196874, dated Nov. 29, 2016; with English translation.
(Continued)

*Primary Examiner* — Marc Armand
*Assistant Examiner* — Sue Tang
(74) *Attorney, Agent, or Firm* — McDermott Will & Emery LLP

(57) ABSTRACT

A source interconnect and a drain interconnect are alternately provided between a plurality of transistor units. One bonding wire is connected to a source interconnect at a plurality of points. The other bonding wire is connected to a source interconnect at a plurality of points. In addition, one bonding wire is connected to a drain interconnect at a plurality of points. In addition, the other bonding wire is connected to a drain interconnect at a plurality of points.

18 Claims, 18 Drawing Sheets

(51) Int. Cl.
*H01L 27/088* (2006.01)
*H01L 27/02* (2006.01)
*H01L 29/778* (2006.01)
*H01L 27/06* (2006.01)
*H01L 27/085* (2006.01)
*H01L 23/482* (2006.01)
*H01L 23/495* (2006.01)
*H01L 29/20* (2006.01)

(52) U.S. Cl.
CPC ........ *H01L 23/49562* (2013.01); *H01L 24/05* (2013.01); *H01L 24/06* (2013.01); *H01L 24/48* (2013.01); *H01L 24/49* (2013.01); *H01L 27/0207* (2013.01); *H01L 27/0605* (2013.01); *H01L 27/085* (2013.01); *H01L 27/088* (2013.01); *H01L 29/7787* (2013.01); H01L 29/2003 (2013.01); H01L 2224/04042 (2013.01); H01L 2224/05552 (2013.01); H01L 2224/05624 (2013.01); H01L 2224/05644 (2013.01); H01L 2224/0605 (2013.01); H01L 2224/091 (2013.01); H01L 2224/45014 (2013.01); H01L 2224/4846 (2013.01); H01L 2224/4847 (2013.01); H01L 2224/48096 (2013.01); H01L 2224/48247 (2013.01); H01L 2224/4903 (2013.01); H01L 2224/49113 (2013.01); H01L 2224/49175 (2013.01); H01L 2224/49431 (2013.01); H01L 2924/00014 (2013.01); H01L 2924/10161 (2013.01); H01L 2924/1305 (2013.01); H01L 2924/13055 (2013.01); H01L 2924/13091 (2013.01); H01L 2924/30101 (2013.01)

(58) Field of Classification Search
CPC ... H01L 24/48; H01L 27/0605; H01L 27/085; H01L 24/49; H01L 29/7787; H01L 29/78681; H01L 2224/04042; H01L 2224/45014
USPC ........................................................ 257/401
See application file for complete search history.

(56) References Cited

U.S. PATENT DOCUMENTS

| | | | |
|---|---|---|---|
| 6,906,385 B2 * | 6/2005 | Moon | H01L 29/41733 257/347 |
| 7,550,764 B2 * | 6/2009 | Jang | H01L 29/78696 257/40 |
| 7,745,253 B2 | 6/2010 | Luechinger | |
| 7,882,482 B2 * | 2/2011 | Ueunten | H01L 23/4824 257/202 |
| 8,685,789 B2 | 4/2014 | Luechinger | |
| 8,685,791 B2 | 4/2014 | Luechinger | |
| 2004/0217488 A1 | 11/2004 | Luechinger | |
| 2005/0269694 A1 | 12/2005 | Luechinger | |
| 2007/0280012 A1 * | 12/2007 | Obayashi | G11C 17/165 365/200 |
| 2008/0230908 A1 * | 9/2008 | Igarashi | H01L 24/03 257/751 |
| 2008/0277697 A1 | 11/2008 | Kobayashi | |
| 2012/0211762 A1 * | 8/2012 | Imada | H01L 23/4952 257/76 |

FOREIGN PATENT DOCUMENTS

| | | |
|---|---|---|
| JP | 2000-133730 A | 5/2000 |
| JP | 2002-299351 A | 10/2002 |
| JP | 2004-336043 A | 11/2004 |
| JP | 2007-243018 A | 9/2007 |
| JP | 2009-206140 A | 9/2009 |
| JP | 2010-278333 A | 12/2010 |
| JP | 2010-283205 A | 12/2010 |
| JP | 2011-210771 A | 10/2011 |
| JP | 2012-015203 A | 1/2012 |
| JP | 2012-109455 A | 6/2012 |
| WO | 2012/043334 A1 | 4/2012 |

OTHER PUBLICATIONS

Chinese Office Action dated Jan. 26, 2018 issued in Chinese Patent Application No. 201410494163.X (with English translation).

* cited by examiner

SEMICONDUCTOR DEVICE

This application is based on Japanese patent application No. 2013-196874, the content of which is incorporated hereinto by reference.

BACKGROUND

Technical Field

The present invention relates to a semiconductor device, and, for example, a technique applicable to a semiconductor device having transistors and interconnects.

Related Art

When semiconductor chips are used, the semiconductor chips are required to be connected to an external terminal such as a lead terminal by a bonding wire or the like.

A technique relating to a semiconductor device using a bonding wire includes, for example, a technique disclosed in Japanese Unexamined Patent Publication No. 2000-133730. In Japanese Unexamined Patent Publication No. 2000-133730, a bipolar transistor and a unipolar transistor are formed in a semiconductor chip. The same wire is connected to an interconnect which is connected to the emitter electrode of the bipolar transistor at a plurality of points. In addition, the same wire is connected to an interconnect which is connected to a drain electrode of the unipolar transistor at a plurality of points. Japanese Unexamined Patent Publication No. 2000-133730 discloses that the delay time of a response of a transistor is shortened with an increase in the number of connecting points of the wire.

On the other hand, transistors using a compound semiconductor layer as a channel have been recently developed. Such transistors have a feature of low on-resistance.

Meanwhile, Japanese Unexamined Patent Publication No. 2009-206140 and Japanese Unexamined Patent Publication No. 2011-210771 disclose that in a semiconductor device having an insulated gate bipolar transistor (IGBT), the wire is connected to the surface electrode of the IGBT at a plurality of points.

In semiconductor devices having a transistor, lowering an on-resistance is required. Such an on-resistance includes a component caused by a transistor and a component caused by an interconnect. The inventors have studied lowering the resistance component caused by an interconnect. Other problems and novel features will be made clearer from the description and the accompanying drawings of the present specification.

SUMMARY

In one embodiment, a semiconductor device includes a first transistor unit, a second transistor unit, and a third transistor unit. These transistor units are arranged side by side in this order in a first direction, and all include a plurality of transistors in which gate electrodes extend in the first direction. A first interconnect extends between the first transistor unit and the second transistor unit, a second interconnect extends on an opposite side to the first interconnect with the first transistor unit interposed therebetween, a third interconnect extends between the second transistor unit and the third transistor unit, and a fourth interconnect extends on an opposite side to the third interconnect with the third transistor unit interposed therebetween. The first interconnect is connected to source electrodes of the plurality of transistors of the first transistor unit and source electrodes of the plurality of transistors of the second transistor unit. The second interconnect is connected to drain electrodes of the plurality of transistors of the first transistor unit. The third interconnect is connected to drain electrodes of the plurality of transistors of the second transistor unit and drain electrodes of the plurality of transistors of the third transistor unit. The fourth interconnect extends in a second direction, and is connected to source electrodes of the plurality of transistors of the third transistor unit. The semiconductor device includes a first bonding member, a second bonding member, a third bonding member, and a fourth bonding member. The first bonding member is connected to the first interconnect at a plurality of points, the second bonding member is connected to the second interconnect at a plurality of points, the second bonding member is connected to the third interconnect at a plurality of points, and the fourth bonding member is connected to the fourth interconnect at a plurality of points.

According to the embodiment, in a semiconductor device having a transistor, it is possible to reduce a resistance component caused by an interconnect.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
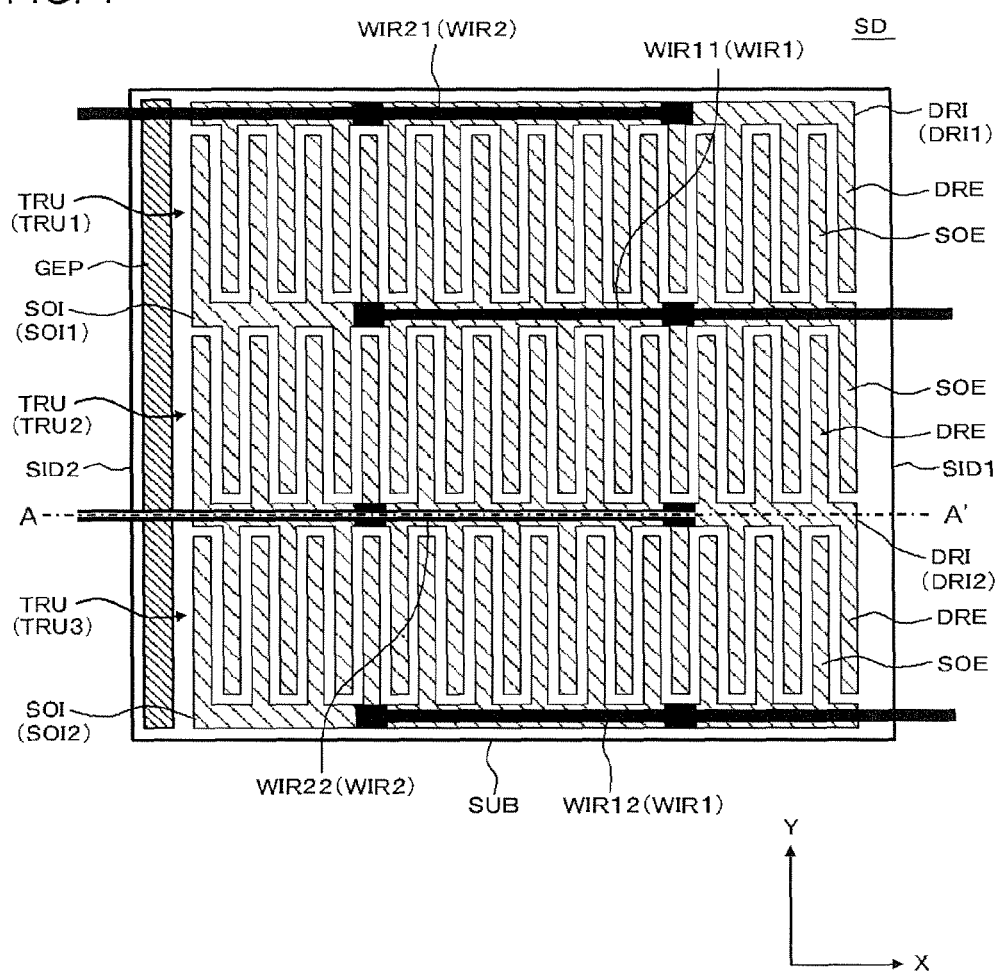
FIG. 1 is a plan view illustrating a configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the accompanying drawings. In all the drawings, like elements are referenced by like reference numerals and descriptions thereof will not be repeated.

(First Embodiment)

Figure 2:
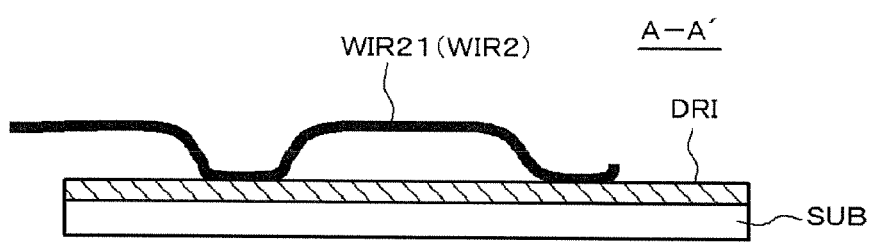
FIG. 2 is a cross-sectional view taken along line A-A' of FIG. 1.

FIG. 1 is a plan view illustrating a configuration of a semiconductor device SD according to a first embodiment. FIG. 2 is a cross-sectional view taken along line A-A' of FIG. 1. The semiconductor device SD shown in the drawing includes a plurality of transistor units TRU (first transistor unit (TRU1), second transistor unit (TRU2), and third transistor unit (TRU3)), a plurality of drain interconnects DRI (second interconnect and third interconnect), and a plurality of source interconnects SOI (first interconnect and fourth interconnect).

The plurality of transistor units TRU are arranged side by side in a first direction (Y direction in the drawing), and include a plurality of transistors TR (described later). The transistor TR is, for example, a transistor for power control, and a gate electrode GE (described later with reference to FIG. 4) extends in a first direction. The plurality of transistor units TRU are all formed using a substrate SUB.

A drain interconnect DRI and a source interconnect SOI are located alternately between the transistor units TRU, and extend in a direction (second direction: X direction in the drawing) intersecting the first direction, for example, a direction perpendicular to the first direction. In other words, the drain interconnect DRI is formed alternately between the transistor units TRU, and the source interconnect SOI is formed in a portion in which the drain interconnect DRI is not arranged between the transistor units TRU. In other words, a first source interconnect SOI1 (first interconnect) extends between the first transistor unit TRU1 and the second transistor unit TRU2, and a second drain interconnect DRI2 (third interconnect) extends between the second transistor unit TRU2 and the third transistor unit TRU3. A first drain interconnect DRI1 (second interconnect) extends on the opposite side to the first transistor unit TRU1 with the first source interconnect SOI1 interposed therebetween, and a second source interconnect SOI2 (fourth interconnect) extends on the opposite side to the third transistor unit TRU3 with the second drain interconnect DRI2 interposed therebetween.

A source electrode SOE of a transistor TR included in the first transistor unit TRU1 and a source electrode SOE of a transistor TR included in the second transistor unit TRU2 are connected to the first source interconnect SOI1. A drain electrode IRE of the transistor TR included in the first transistor unit TRU1 is connected to the first drain interconnect DRI1. A drain electrode DRE of the transistor TR included in the second transistor unit TRU2 and a drain electrode DRE of the transistor TR included in the third transistor unit TRU3 are connected to the second drain interconnect DRI2. A source electrode SUE of a transistor TR included in the third transistor unit TRU3 is connected to the second source interconnect SOI2.

Meanwhile, in the example shown in the drawing, the semiconductor device SD includes only three transistor units TRU, but may include many more transistor units TRU. In this case, a drain electrode of a transistor TR included in the transistor unit TRU (not shown) which is located next the first transistor unit TRU1 is further connected to the first drain interconnect DRI1. In addition, a source electrode of a transistor TR included in the transistor unit TRU (not shown) which is located next the third transistor unit TRU3 is further connected to the second source interconnect SOI2.

The semiconductor device SD further includes a plurality of bonding wires WIR1 and a plurality of bonding wires WIR2. One end of the bonding wire WIR1 is connected to the source interconnect SOI, and one end of the bonding wire WIR2 is connected to the drain interconnect DRI.

Specifically, one bonding wire WIR1 (first bonding wire WIR11) is connected to the source interconnect SOI1 (first interconnect) at a plurality of points. The other bonding wire WIR1 (fourth bonding wire WIR12) is connected to the source interconnect SOI2 (fourth interconnect) at a plurality of points. In addition, one bonding wire WIR2 (second bonding wire WIR21) is connected to the drain interconnect DRI1 (second interconnect) at a plurality of points. In addition, the other bonding wire WIR2 (third bonding wire WIR22) is connected to the drain interconnect DRI2 (third interconnect) at a plurality of points.

Meanwhile, both the other end of the bonding wire WIR1 and the other end of the bonding wire WIR2 are connected to an external terminal (for example, a lead terminal of a lead frame).

In the example shown in the drawing, the substrate SUB is rectangular. When seen in a plan view, each of the bonding wires WIR1 extends from a side SID1 (first side in the present embodiment) of the substrate SUB to the outside of the substrate SUB, and each of the bonding wires WIR2 extends from a side SID2 (third side in the present embodiment), on the opposite side to the side SID1 of the substrate SUB, to the outside of the substrate SUB. Therefore, it is possible to reduce a risk of the occurrence of dielectric breakdown between the bonding wire WIR1 and the bonding wire WIR2. Meanwhile, both the sides SID1 and SID2 are sides intersecting a direction in which the source interconnect SOI and the drain interconnect DRI in four sides of the substrate SUB extend.

Figure 3:
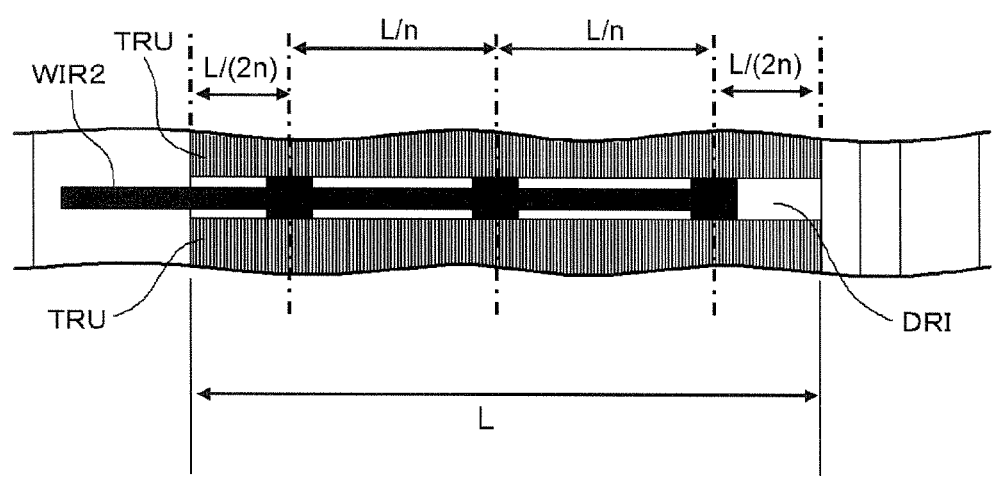
FIG. 3 is a diagram illustrating points at which a bonding wire is connected to a drain interconnect.

FIG. 3 is a diagram illustrating points at which the bonding wire WIR2 is connected to the drain interconnect DRI. As described above, the bonding wire WIR2 is connected to the drain interconnect DRI at a plurality of points. When the number of connecting points is set to n, and the length of the drain interconnect DRI is set to L, a space between the connecting points becomes equal to L/n. In addition, a space between a connecting point closest to an end of the drain interconnect DRI and the end of the drain interconnect DPI is L/(2n). In the example shown in the drawing, the relation of n=3 is established, and the space between the connecting points is L/3. The space between the connecting point closest to the end of the drain interconnect DRI and the end of the drain interconnect DRI is L/6. In this manner, it is possible to suppress the concentration of a current on a specific portion of the drain interconnect DRI.

Meanwhile, points at which the bonding wire WIR1 is connected to the source interconnect SOI are also similar to the example shown in FIG. 3.

Figure 4:
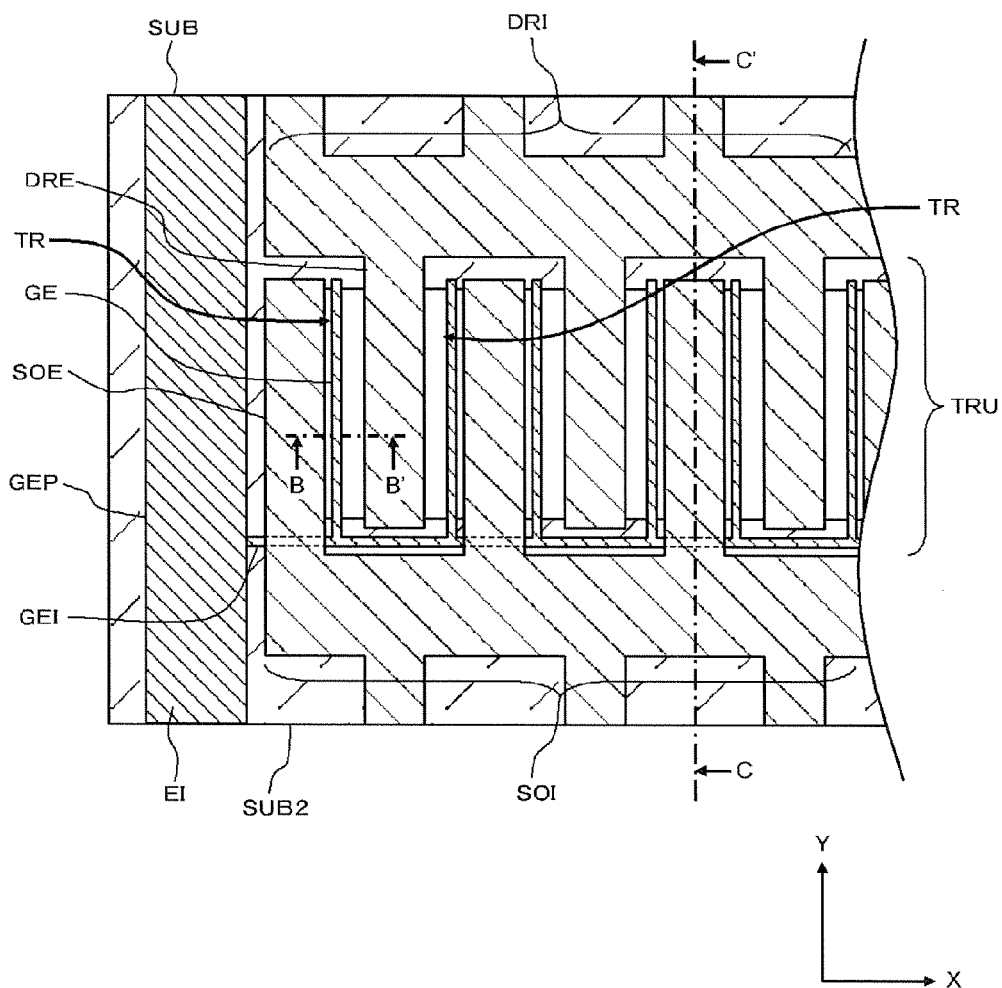
FIG. 4 is a plan view illustrating a configuration of a transistor unit.

FIG. 4 is a plan view illustrating a configuration of the transistor unit TRU. The semiconductor device SD is formed using the substrate SUB. An element isolation region EI is formed in the substrate SUB. The element isolation region EI isolates a region (hereinafter, denoted as an element forming region) in which a plurality of transistors TR are formed, from other regions. The element isolation region EI is a region in which resistance is increased by introducing high-concentration B into, for example, a barrier layer BAR (described later with reference to FIG. 5) and a channel layer CNL (described later with reference to FIG. 5). The lower end of the element isolation region EI is located at the surface layer of a buffer layer BUF.

The element forming region is provided in each of the transistor units TRU. The plurality of transistors TR are formed in the element forming region. The plurality of transistors TR are lined up in the second direction (X direction). The plurality of transistors TR have the gate electrodes GE. The plurality of gate electrodes GE extend in parallel to each other first in a direction (Y direction). Specifically, the element forming region is rectangular. The gate electrode GE extends in parallel to the short side of the element forming region. The gate electrode GE is formed of, for example, a metal containing Au or Al.

Both ends of the gate electrode GE are located on the element isolation region EI. One end of the gate electrode GE is connected to a gate plate GEP with a gate interconnect GEI interposed therebetween. The gate interconnect GEI is formed above the element isolation region EI, and extends in the second direction (X direction). That is, the gate electrode GE has a comb-teeth shape.

The source electrode SOE and the drain electrode DRE are alternately provided between the gate electrodes GE. In other words, the source electrode SOE, the gate electrode GE, the drain electrode DRE, and the gate electrode GE are repeatedly arranged in the element forming region in this order along the second direction (X direction). A plurality of source electrodes SOE are connected in parallel to each other with the source interconnect SOI interposed therebetween, and a plurality of drain electrodes DRE are connected to each other with the drain interconnect DRI interposed therebetween.

The source interconnect SOT is formed integrally with the source electrode SOE, and thus may be a portion of the source electrode SOE. Similarly, the drain interconnect DRI is formed integrally with the drain electrode DRE, and thus may be a portion of the drain electrode DRE. That is, in the present embodiment, both the source electrode SOE and the drain electrode DRE have a comb-teeth shape. Meanwhile, the source electrode SOE and the drain electrode DRE are, for example, Al.

Meanwhile, the source interconnect SOT included in the transistor units TRU adjacent to each other is arranged alternately in a direction (X direction in the drawing) in which the source interconnect SOI extends, the drain interconnect DRI included in the transistor units TRU adjacent to each other is also arranged alternately.

Figure 5:
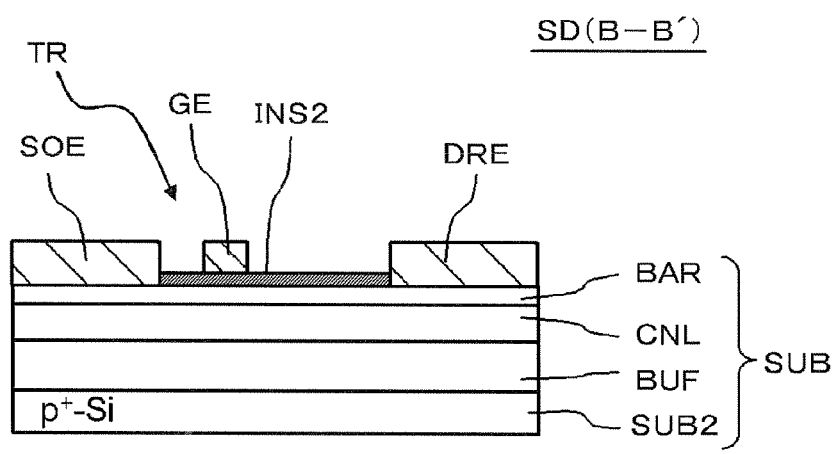
FIG. 5 is a diagram illustrating a first example of cross-section B-B' of FIG. 4.

FIG. 5 is a diagram illustrating a first example of cross-section B-B' of FIG. 4. The substrate SUB has a configuration in which the buffer layer BUS, the channel layer CNL, and the barrier layer BAR are epitaxially grown on a substrate SUB2 in this order. The substrate SUB2 is, for example, a silicon substrate of a p$^+$-type bulk. The buffer layer BUF is a buffer between the channel layer CNL and the substrate SUB2. The buffer layer BUF is a nitride semiconductor layer in which a compound semiconductor layer, for example, AlN/GaN is repeatedly laminated. The channel layer CNL is a layer which is epitaxially grown on the buffer layer BUF. The channel layer CNL is, for example, GaN, but may be AlGaN such as other nitride semiconductor layers. The barrier layer BAR is formed of a material having a lattice constant different from that of the channel layer CNL. The barrier layer BAR is, for example, AlGaN. The barrier layer BAR is formed, and thus two-dimensional electron gas serving as a carrier is generated in the channel layer CNL.

The drain electrode DRE and the source electrode SOB are formed on the barrier layer BAR. Further, an insulating film INS2 and the gate electrode GE are formed on a region of the barrier layer BAR located between the drain electrode DRE and the source electrode SOE. In the example shown in the drawing, the insulating film INS2 also serves as a gate insulating film. In the example shown in the drawing, the insulating film INS2 is, for example, $Al_2O$ or $SiO_2$ in an amorphous state. In the example shown in the drawing, a distance from the gate electrode GE to the drain electrode DRE is longer than a distance from the gate electrode GE to the source electrode SOS in order to provide withstand voltage between the gate and the drain.

Figure 6:
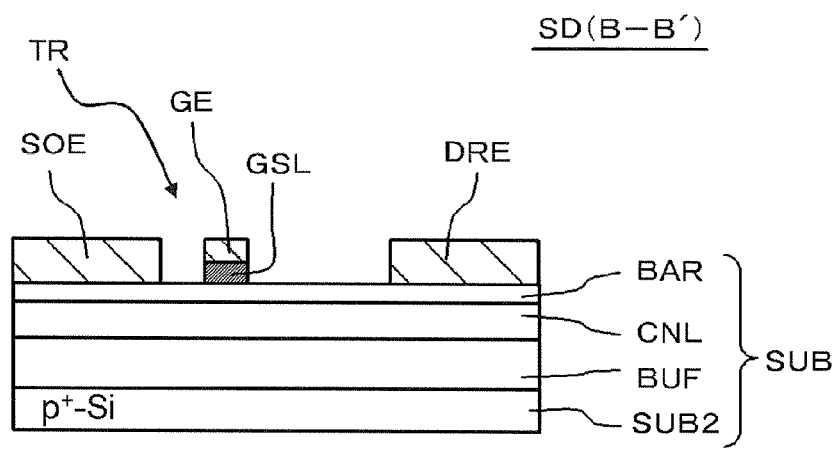
FIG. 6 is a diagram illustrating a second example of cross-section B-B' of FIG. 4.

FIG. 6 is a diagram illustrating a second example of cross-section B-B' of FIG. 4. The example shown in the drawing has the same configuration as that in the first example shown in FIG. 3, except that a compound semiconductor layer GSL rather than a gate insulating film GINS is formed between the gate electrode GE and the barrier layer BAR. The compound semiconductor layer GSL is a nitride semiconductor layer (for example, AlGaN or GaN) having the same conductivity-type (for example, p-type) as that of the substrate SUB2. Meanwhile, in the example shown in the drawing, the barrier layer BAR and the channel layer CNL are compound semiconductor layers having a reverse conductivity-type (for example, n-type) to that of the substrate SUB2.

Figure 7:
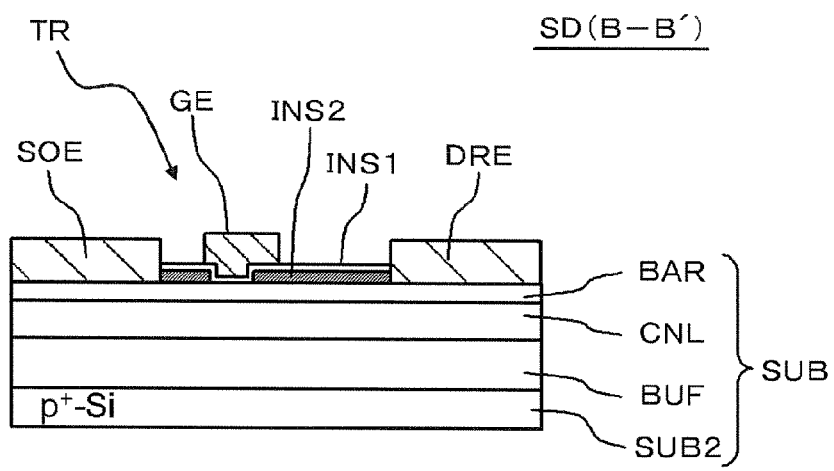
FIG. 7 is a diagram illustrating a third example of cross-section B-B' of FIG. 4.

FIG. 7 is a diagram illustrating a third example of cross-section B-B' of FIG. 4. In the example shown in the drawing, the transistor TR is a metal-insulator-semiconductor hetero-junction field-effect transistor (MIS-HJ-FET). Specifically, a portion of the gate electrode GE is buried in the insulating film INS2, and is connected to the barrier layer BAR with an insulating film INS1 interposed therebetween. The insulating film INS1 is formed on the insulating film INS2 and between the insulating film INS2 and the gate electrode GE. In the example shown in the drawing, the insulating film INS1 also serves as a gate insulating film. In the example shown in the drawing, the insulating film INS2 is, for example, a SiN film. The insulating film INS1 is, for example, $Al_2O_3$ or $SiO_2$ in an amorphous state. In such a structure, two-dimensional electron gas formed in the channel layer CNL is interrupted in a portion located below the gate electrode GE. For this reason, in a state where a voltage smaller than a threshold is applied to the gate electrode GE, a current does not flow through the channel layer CNL. When a voltage is applied to the gate electrode GE, a current flows through the channel layer CNL.

Figure 8:
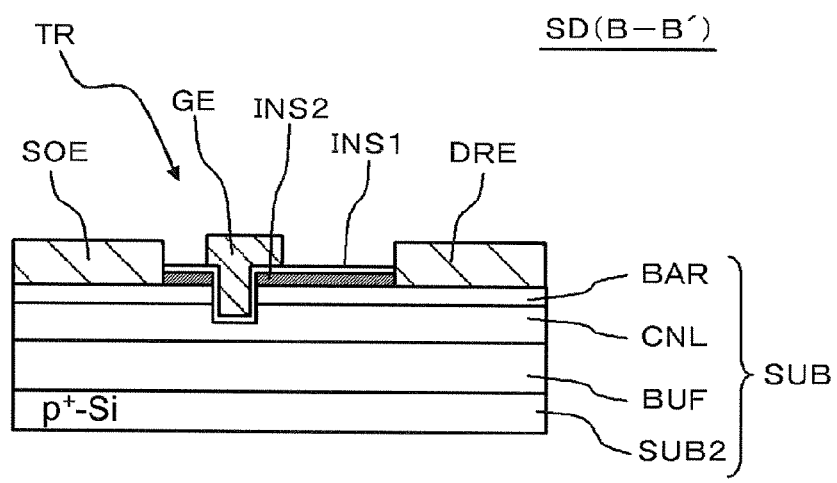
FIG. 8 is a diagram illustrating a fourth example of cross-section B-B' of FIG. 4.

FIG. 8 is a diagram illustrating a fourth example of cross-section B-B' of FIG. 4. In the example shown in the drawing, the transistor TR is a metal-insulator-semiconductor field-effect transistor (MIS-FET), and a normally-off type transistor. Specifically, a portion of the gate electrode GE passes through the insulating film INS2 and barrier layer BAR, and reaches the channel layer CNL. The insulating film INS1 is formed between the insulating film INS2, barrier layer BAR and channel layer CNL, and the gate electrode GE. The configurations of the insulating films INS1 and INS2 are the same as those in the second example shown in FIG. 6. The insulating film INS1 also serves as a gate insulating film. The two-dimensional electron gas formed in the channel layer CNL is segregated by the gate electrode GE. For this reason, in a state where a voltage is not applied to the gate electrode GE, a current does not flow through the channel layer CNL. When a voltage equal to or greater than a threshold is applied to the gate electrode GE, a current flows through the channel layer CNL.

Figure 9:
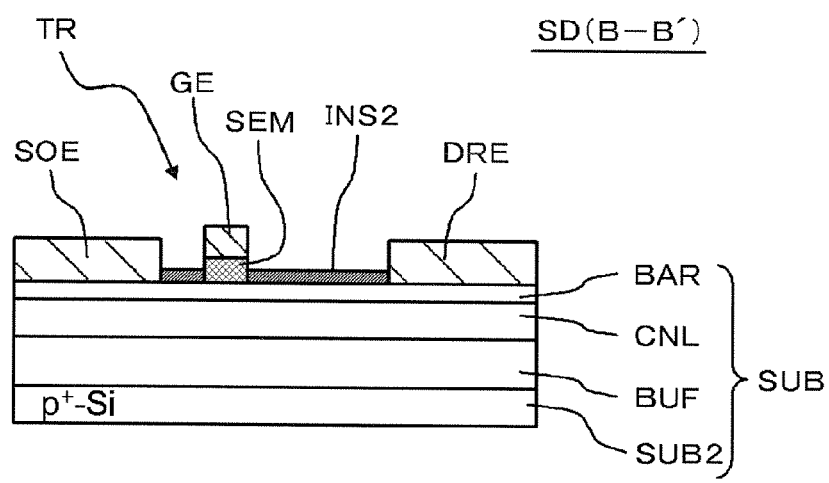
FIG. 9 is a diagram illustrating a fifth example of cross-section B-B' of FIG. 4.

FIG. 9 is a diagram illustrating a fifth example of cross-section B-B' of FIG. 4. In the example shown in the drawing, the transistor TR is a junction field-effect transistor (J-FET), and is a normally-off type transistor. Specifically, a first conductivity-type layer SEM is formed between the barrier layer BAR and the gate electrode GE. The first conductivity-type layer SEM is, for example, AlGaN.

Figure 10:
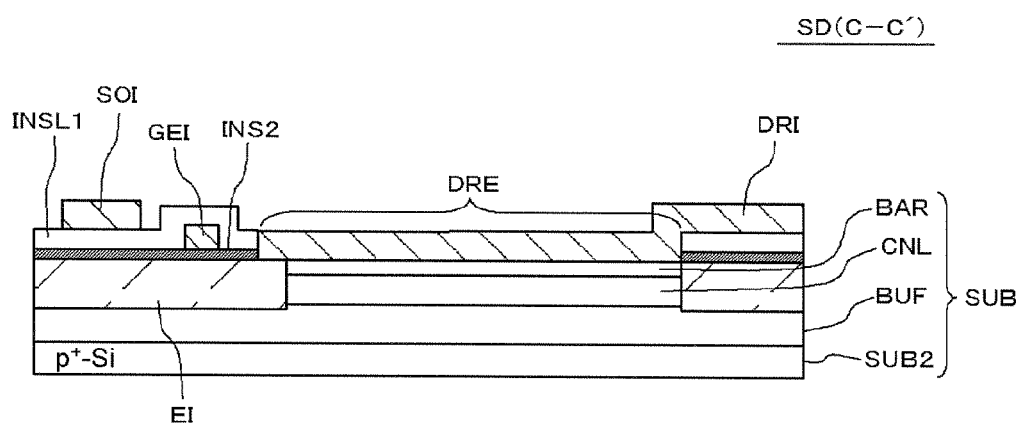
FIG. 10 is a cross-sectional view taken along line C-C' of FIG. 4.

FIG. 10 is a cross-sectional view taken along line C-C' of FIG. 4. The insulating film INS2 is also formed on the element isolation region EI. The gate interconnect GEI is located on the insulating film INS2. An insulating interlayer INSL1 is formed on the insulating film INS2 and on the gate interconnect GEI. The insulating interlayer INSL1 is formed of, for example, a SiN film. The insulating interlayer INSL1 is not formed on the element forming region. The source interconnect SOI and the drain interconnect DRI are formed on the insulating interlayer INSL1.

Next, an example of a method of manufacturing the semiconductor device SD will be described. First, the buffer layer BUF, the channel layer CNL, and the barrier layer BAR are epitaxially grown on the substrate SUB2 in this order. Meanwhile, a substrate may be prepared in which the buffer layer BUF and the channel layer CNL are formed on the substrate SUB2. Next, the element isolation region EI is formed in the barrier layer BAR and the channel layer CNL.

Next, the insulating film INS2 is formed on the barrier layer BAR and the element isolation region EI using, for example, a CVD method. Next, a film serving as the gate electrode GE, the gate interconnect GEI, and the gate plate GEP is formed on the insulating film INS2 using a sputtering method. Next, this film is selectively removed. Thereby, the gate electrode GE, the gate interconnect GEI, and the gate plate GEP are formed. Next, the insulating interlayer INSL1 is formed on the gate electrode GE and the insulating film INS2 using a CVD method.

Next, a mask pattern is formed on the insulating interlayer INSL1, and the insulating interlayer INSL1 is etched using the mask pattern as a mask. Thereby, a portion of the insulating interlayer INSL1 which is located at the element forming region is removed. Thereafter, the mask pattern is removed.

Next, a metal film serving as the source electrode SOE, the source interconnect SOI, the drain electrode DRE, and the drain interconnect DRI is formed on the insulating interlayer INSL1, and on the barrier layer BAR located within the element forming region using, for example, a sputtering method. Next, this metal film is selectively removed. Thereby, the source electrode SOE, the source interconnect SOI, the drain electrode DRE, and the drain interconnect DRI are formed.

Thereafter, the bonding wire WIR1 is connected to the source interconnect SOT at a plurality of points, and the bonding wire WIR2 is connected to the drain interconnect DRI at a plurality of points.

Next, an effect of the present embodiment will be described. According to the present embodiment, the first source interconnect SOI is connected to the source electrode SOE included in the first transistor unit TRU1 and the source electrode SOE included in the second transistor unit TRU2. In addition, the first drain interconnect DRI is connected to the drain electrode DRE included in the second transistor unit TRU2 and the drain electrode DRE included in the third transistor unit TRU3. For this reason, only any one of the drain interconnect DRI and the source interconnect SOI is required to be provided between the transistor units TRU adjacent to each other. Therefore, compared to a case where both the drain interconnect DRI and the source interconnect SOI are arranged between the transistor units TRU adjacent to each other, an interconnect width can be increased to an extent of a space that is not needed between the drain interconnect DRI and the source interconnect SOI which are adjacent to each other. Therefore, it is possible to lower a resistance component caused by the interconnect in a parasitic resistance included in the semiconductor device SD.

In addition, the bonding wire WIR1 is connected to the source interconnect SOI at a plurality of points, and the bonding wire WIR2 is connected to the drain interconnect DRI at a plurality of points. Therefore, both a connection resistance between the bonding wire WIR1 and the source interconnect SOI, and a connection resistance between the bonding wire WIR2 and the drain interconnect DRI are reduced. Further, since the resistance of the bonding wires WIR1 and WIR2 per unit length is much lower than the resistance of the source interconnect or the drain interconnect within a semiconductor chip, the entire interconnect resistance component is also reduced.

Particularly, in the present embodiment, the channel of the transistor TR is formed in the channel layer CNL. The channel layer CNL is a compound semiconductor layer, and has a resistance lower than that of silicon. In this case, even when the parasitic resistance of the transistor TR is reduced, the meaning of using a compound semiconductor layer is reduced in a state where the interconnect resistance or the connection resistance becomes larger. In the present embodiment, since the resistance component caused by the interconnect can be lowered, an effect of using a compound semiconductor layer in the channel layer of the transistor TR increases.

(Second Embodiment)

Figure 11:
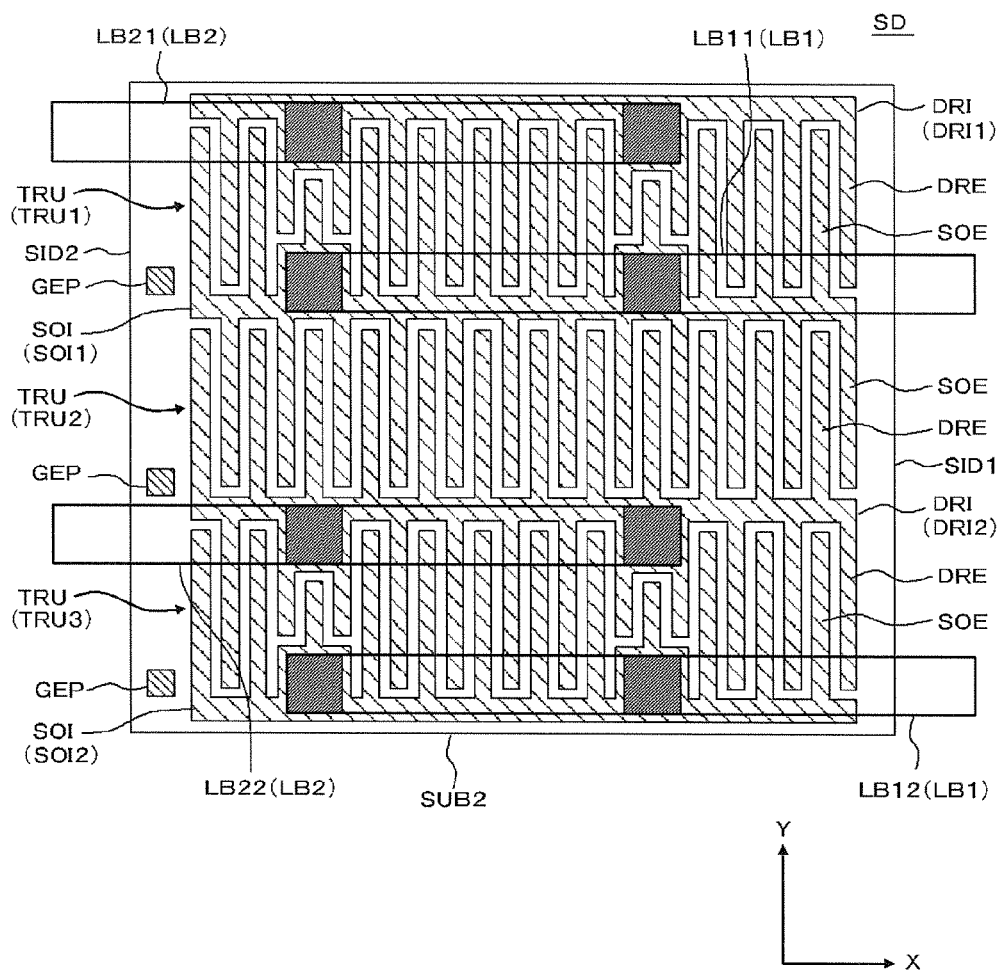
FIG. 11 is a plan view illustrating a configuration of a semiconductor device according to a second embodiment.

FIG. 11 is a plan view illustrating a configuration of a semiconductor device SD according to a second embodiment. The semiconductor device SD according to the present embodiment has the same configuration as that of the semiconductor device SD according to the first embodiment, except for the following points.

First, the semiconductor device SD includes a bonding ribbon LB1 (first bonding ribbon LB11 and a fourth bonding ribbon LB12) instead of the bonding wire WIR1, and includes a bonding ribbon LB2 (second bonding ribbon LB21 and a third bonding ribbon LB22) instead of the bonding wire WIR2. Both the bonding ribbons LB1 and LB2 have widths greater than those of the bonding wires WIR1 and WIR2, and have lower resistances per unit length. The widths of the bonding ribbons LB1 and LB2 are, for example, more than ten times the thicknesses of the bonding ribbons LB1 and LB2.

The width of a portion of the source interconnect SOI to which the bonding ribbon LB1 is connected is greater than the widths of other portions of the source interconnect SOI. Similarly, the width of a portion of the drain interconnect DRI to which the bonding ribbon LB2 is connected is greater than the widths of other portions of the drain interconnect DRI. Meanwhile, in the example shown in the drawing, the source interconnect SOI and the drain interconnect DRI become larger in width toward the first transistor unit TRU1 (or the third transistor unit TRU3), but do not become larger in width in a direction toward the second transistor unit TRU2. For this reason, the effective area of the second transistor unit TRU2 is not reduced.

In the present embodiment, the same effect as that in the first embodiment is also obtained. In addition, since the bonding ribbons LB1 and LB2 are used instead of the bonding wires WIR1 and WIR2, it is possible to reduce a resistance between the drain interconnect DRI and the source interconnect SOI, and an external terminal. In addition, since the area of each connecting point also increases, the connection resistance between the drain interconnect DRI and the bonding ribbon LB2 is also reduced, and the connection resistance between the source interconnect SOI and the bonding ribbon LB1 is reduced as well. Therefore, an effect of using a compound semiconductor layer in the channel layer of the transistor TR further increases.

(Third Embodiment)

Figure 12:
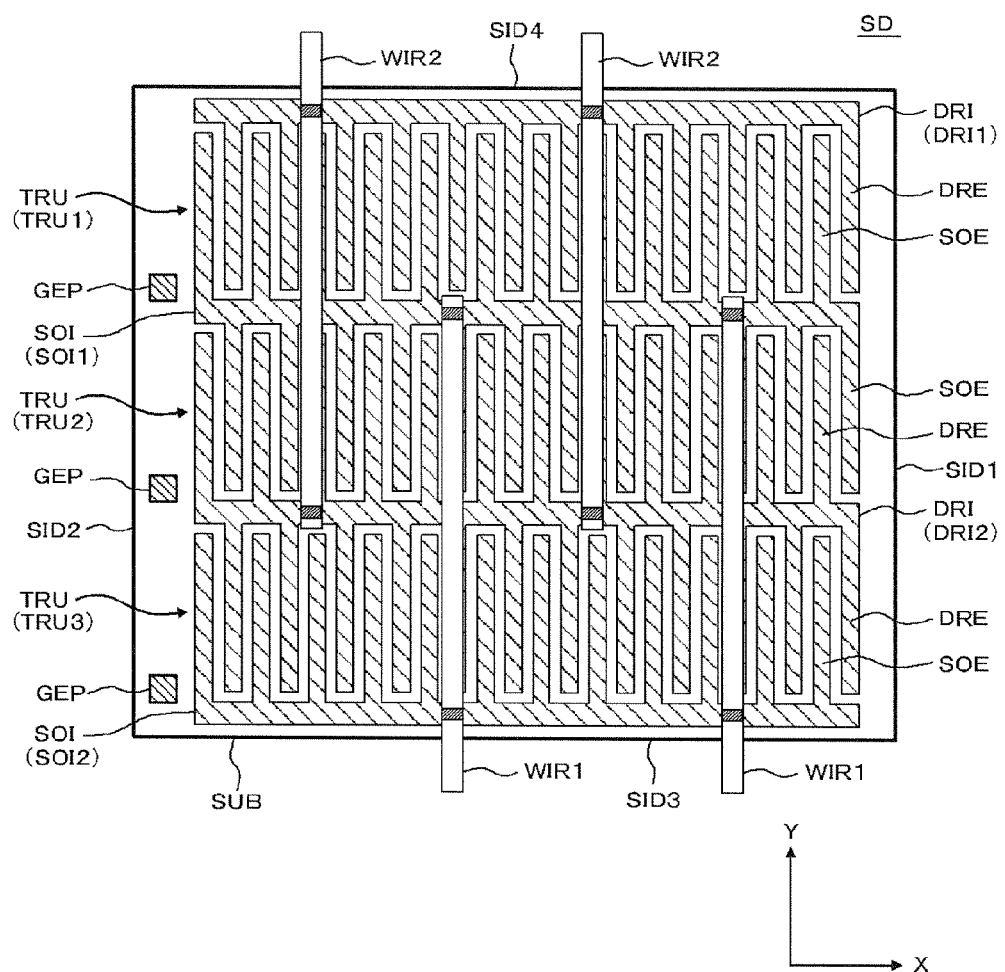
FIG. 12 is a plan view illustrating a configuration of a semiconductor device according to a third embodiment.

FIG. 12 is a plan view illustrating a configuration of a semiconductor device SD according to a third embodiment. The semiconductor device SD according to the present embodiment has the same configuration as that of the semiconductor device SD according to the first embodiment, except for the following points.

First, both the bonding wire WIR1 and the bonding wire WIR2 extend in a direction intersecting (for example, a direction perpendicular to) the source interconnect SOI and the drain interconnect DRI. Each of the bonding wires WIR1 is connected to all the source interconnects SOI (for example, source interconnect SOI1 (first interconnect) and source interconnect SOI2 (fourth interconnect)). In addition, each of the bonding wires WIR2 is connected to all the drain interconnects DRI (for example, drain interconnect DRI1 (second interconnect) and drain interconnect DRI2 (third interconnect)).

When seen in a plan view, the end of the bonding wire WIR1 on the side which is not connected to the source interconnect SOI extends from a side SID3 (first side in the present embodiment) different from the sides SID1 and SID2, that is, a side in a parallel direction to the source interconnect SOI and the drain interconnect DRI to the outside of the substrate SUB. In addition, the end of the bonding wire WIR2 on the side which is not connected to the drain interconnect DRI extends from a side SID4 (second side in the present embodiment), on the opposite side to the side SID3, to the outside of the substrate SUB.

According to the present embodiment, the plurality of bonding wires WIR1 are connected to the one source interconnect SOI, and the plurality of bonding wires WIR2 are connected to the one drain interconnect DRI. For this reason, both the connection resistance between the bonding wire WIR1 and the source interconnect SOI and the connection resistance between the bonding wire WIR2 and the drain interconnect DRI are reduced. Therefore, the same effect as that in the first embodiment is obtained.

Figure 13:
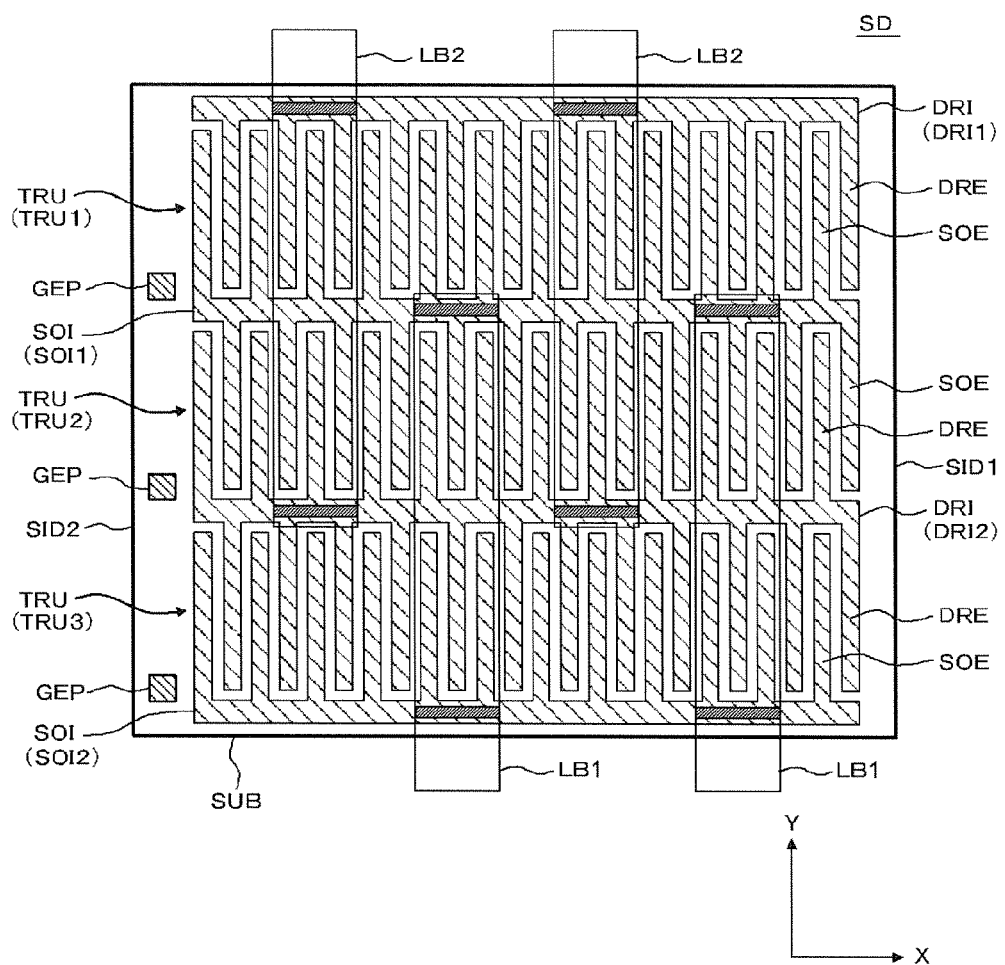
FIG. 13 is a diagram illustrating of modified example of FIG. 12.

Meanwhile, in the present embodiment, as shown in FIG. 13, the bonding ribbons LB1 and LB2 may be used instead of the bonding wires WIR1 and WIR2. In this case, the same effect as that in the second embodiment is obtained. In addition, portions of the source interconnect SOI and the drain interconnect DRI which are connected to the bonding ribbons are not required to be widened. Therefore, as compared with the second embodiment, it is possible to increase the effective area of the transistor unit TRU.

In addition, when seen in a plan view, the bonding ribbon LB1 and the bonding ribbon LB2 extend in reverse directions from each other. Therefore, it is possible to reduce a risk of the occurrence of dielectric breakdown between the bonding ribbon LB1 and the bonding ribbon LB2.

(Fourth Embodiment)

Figure 14:
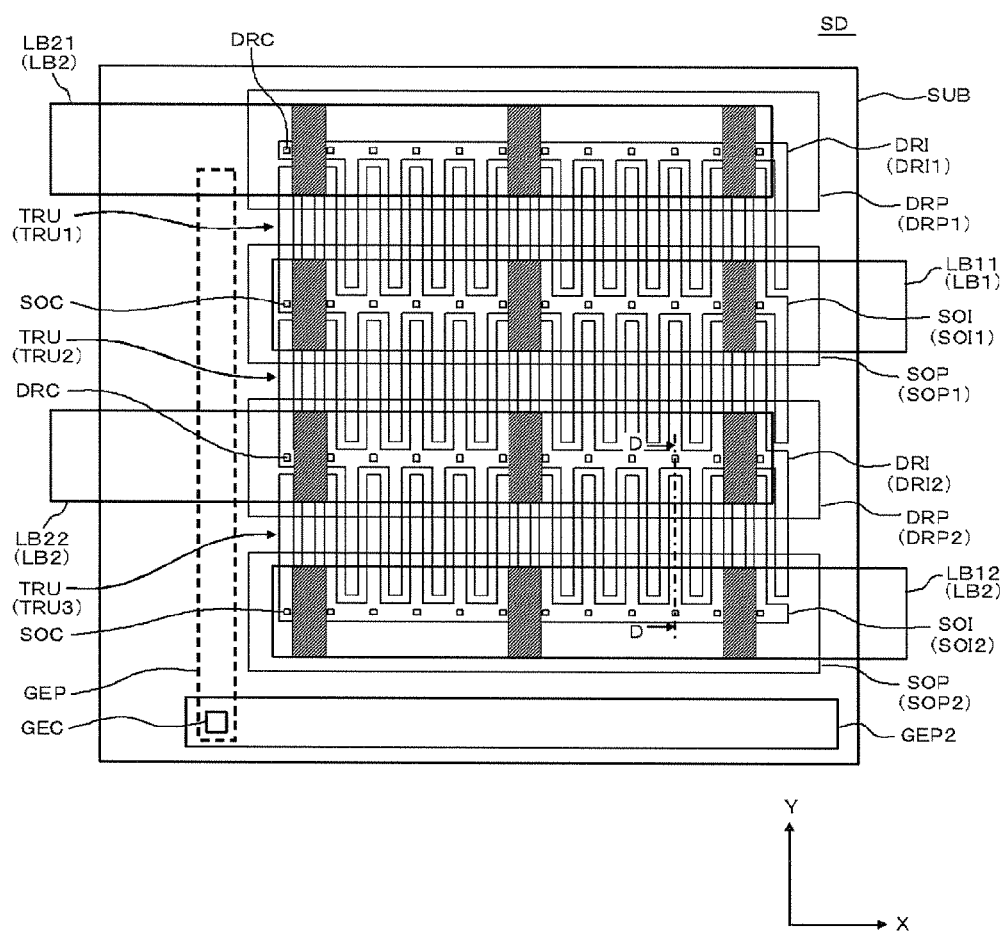
FIG. 14 is a plan view illustrating a configuration of a semiconductor device according to a fourth embodiment.
Figure 15:
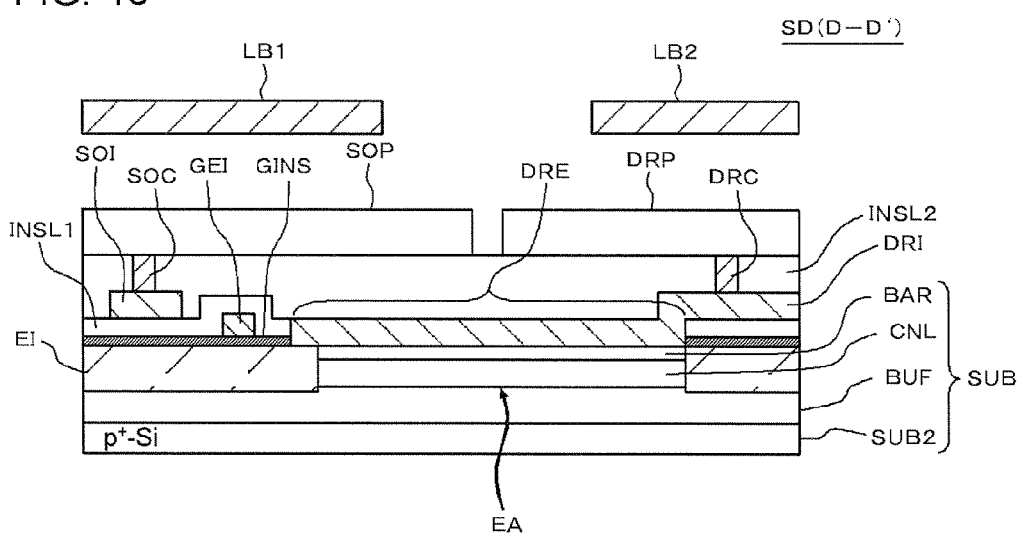
FIG. 15 is a cross-sectional view taken along line D-D' of a semiconductor device shown in FIG. 14.

FIG. 14 is a plan view illustrating configuration of a semiconductor device SD according to a fourth embodiment, and FIG. 15 is a cross-sectional view taken along line D-D' of the semiconductor device SD shown in FIG. 14. FIG. 14 corresponds to FIG. 1 in the first embodiment, and FIG. 15 corresponds to FIG. 10 in the first embodiment. The semiconductor device SD according to the present embodiment has the same configuration as that of the semiconductor device SD according to the first or second embodiment, except for the following points. The drawings show the same case as in the first embodiment.

First, the semiconductor device SD includes a plurality of drain pad electrodes DRP (second upper-layer conductive pattern and third upper-layer conductor pattern), a plurality of drain contacts DRC (second connecting member and third connecting member), a plurality of source pad electrodes SOP (first upper-layer conductive pattern and fourth upper-layer conductor pattern), and a plurality of source contacts SOC (first connecting member and fourth connecting member).

Both the source pad electrode SOP and the drain pad electrode DRP are provided above the drain interconnect DRI and the source interconnect SOI, and have widths greater than those of the drain interconnect DRI and the source interconnect SOI. The source pad electrode SOP and the drain pad electrode DRP extend in the second direction (X direction in the drawing).

As shown in FIG. 14, at least a portion of the source pad electrode SOP overlaps the source interconnect SOI, and at least a portion of the drain pad electrode DRP overlaps the drain interconnect DRI. A plurality of source contacts SOC are located in a region where the source pad electrode SOP and the source interconnect SOI overlap each other. In addition, a plurality of drain contacts DRC are located in a region where the drain pad electrode DRP and the drain interconnect DRI overlap each other. The source contact SOC connects the source interconnect SOI to the source pad electrode SOP, and the drain contact DRC connects the drain interconnect DRI to the drain pad electrode DRP. The source pad electrode SOP is provided in order to lower the apparent resistance of the source interconnect SOI, and the drain pad electrode DRP is provided in order to lower the apparent resistance of the drain interconnect DRI.

As shown in FIG. 15, an insulating interlayer INSL2 is formed on the source interconnect SOT, the drain interconnect DRI, and the insulating interlayer INSL1. The insulating interlayer INSL2 is, for example, a silicon oxide film. The source pad electrode SOP and the drain pad electrode DRP are formed on the insulating interlayer INSL2, and the source contact SOC and the drain contact DRC are buried in the insulating interlayer INSL2. The source contact SOC may be formed integrally with the source pad electrode SOP. Similarly, the drain contact DRC may be formed integrally with the drain pad electrode DRP. The source pad electrode SOP and the drain pad electrode DRP are formed of, for example, a metal such as Al.

In addition, as shown in FIG. 14, when seen in a plan view, a portion of the drain pad electrode DRP (first drain pad electrode DRP1) connected to the first drain interconnect DRI1 overlaps the first transistor unit TRU1. In addition, a portion of the source pad electrode SOP (first source pad electrode SOP1) connected to the first source interconnect SOI1 overlaps at least one of the first transistor unit TRU1 and the second transistor unit TRU2. In addition, a portion of a second drain pad electrode DRP2 connected to the second drain interconnect DRI2 overlaps at least one of the second transistor unit TRU2 and the third transistor unit TRU3. Further, a portion of a second source pad electrode SOP2 connected to the second source interconnect SOI2 overlap the third transistor unit TRU3. In this manner, even when the planar shape of the semiconductor device SD is not increased, it is possible to increase the planar shapes of the drain pad electrode DRP and the source pad electrode SOP, and to further reduce the apparent resistance of the source electrode SOE and the apparent resistance of the drain electrode DRE.

In the example shown in the drawing, a portion of the first source pad electrode SOP overlaps the first transistor unit TRU1, and another portion of the first source pad electrode SOP overlaps the second transistor unit TRU2. The width of the portion of the first source pad electrode SOP1 which overlaps the first transistor unit TRU1 and the width of the portion of the first source pad electrode SOP1 which overlaps the second transistor unit TRU2 are substantially equal to each other. In addition, a portion of the second drain pad electrode DRP2 overlaps the second transistor unit TRU2, and another portion of the second drain pad electrode DRP2 overlaps at least one third transistor unit TRU3. The width of the portion of the second drain pad electrode DRP2 which overlaps the second transistor unit TRU2 and the width of the portion of the second drain pad electrode DRP2 which overlaps the third transistor unit TRU3 are substantially equal to each other.

However, the width of the portion of the first source pad electrode SOP1 which overlaps the first transistor unit TRU1 and the width of the portion of the first source pad electrode SOP1 which overlaps the second transistor unit TRU2 may be different from each other. In addition, the width of the portion of the second drain pad electrode DRP2 which overlaps the second transistor unit TRU2 and the width of the portion of the second drain pad electrode DRP2 which overlaps the third transistor unit TRU3 may also be different from each other.

In addition, the first drain pad electrode DRP1 may overlap only the second transistor unit TRU2, and the second source pad electrode SOP2 may overlap only the third transistor unit TRU3.

In addition, as shown in FIG. 15, a gate pad electrode GEP is formed on the same layer as the source pad electrode SOP and the drain pad electrode DRP. A gate pad electrode GEP2 is connected to the gate plate GEP through a gate contact GEC buried in the insulating interlayer INSL2.

The bonding ribbon LB1 (or bonding wire WIR1) is connected to the source pad electrode SOP, and the bonding ribbon LB2 (or bonding wire WIR2) is connected to the drain pad electrode DRP. The structure of the connection of the bonding ribbon LB1 (or bonding wire WIR1) to the source pad electrode SOP is the same as the structure of the connection of the bonding wire WIR1 to the source interconnect SOI in the first or second embodiment. In addition, the structure of the connection of the bonding ribbon LB2 (or bonding wire WIR2) to the drain pad electrode DRP is the same as the structure of the connection of the bonding wire WIR2 to the drain interconnect DRI in the first or second embodiment.

In the present embodiment, the same effect as that in the first or second embodiment is also obtained. In addition, since the source pad electrode SOP and the drain pad electrode DRP are provided, it is possible to lower the apparent resistance of the source electrode SOE and the apparent resistance of the drain electrode DRE.

(Fifth Embodiment)

Figure 16:
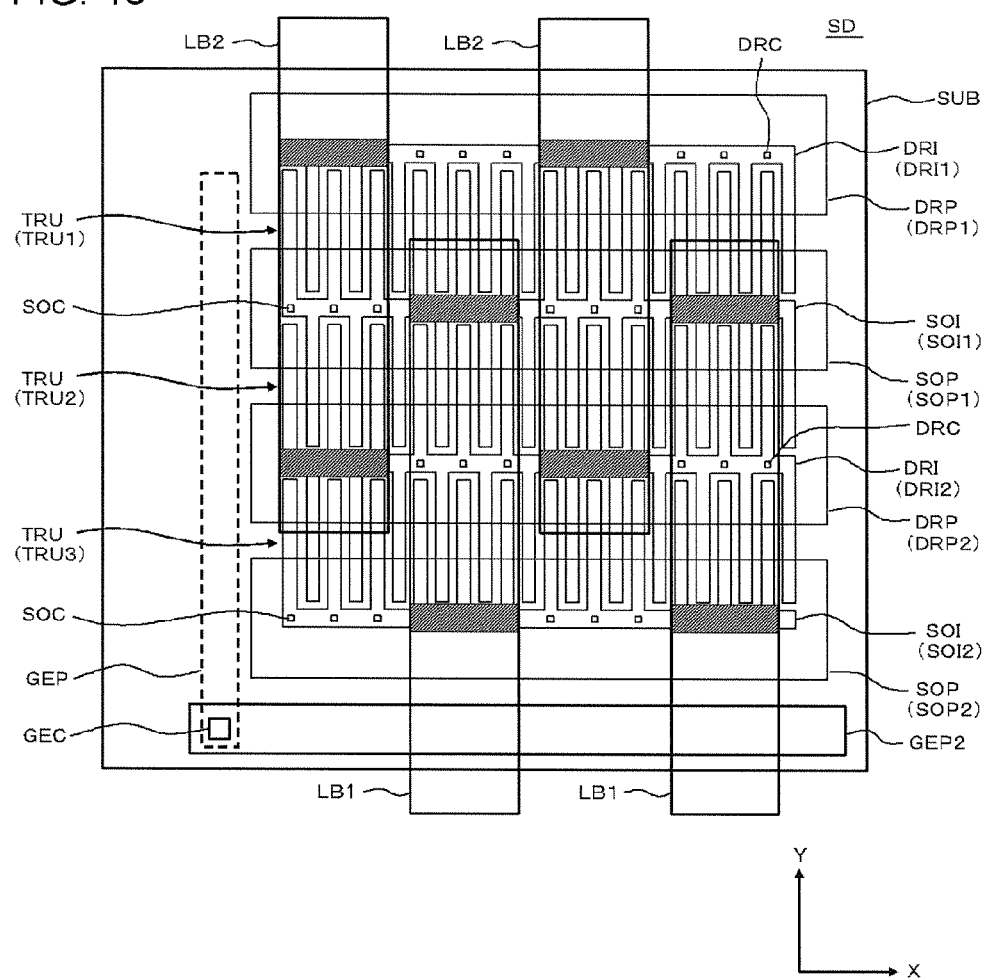
FIG. 16 is a diagram illustrating a configuration of a semiconductor device according to a fifth embodiment.

FIG. 16 is a diagram illustrating a configuration of a semiconductor device SD according to a fifth embodiment. The semiconductor device SD according to the present embodiment has the same configuration as that of the semiconductor device SD according to the third embodiment, except for the following points.

First, the semiconductor device SD includes the drain pad electrode DRP and the source pad electrode SOP according to the fourth embodiment. The bonding ribbon LB1 (or bonding wire WIR1) is connected to the source pad electrode SOP, and the bonding ribbon LB2 (or bonding wire WIR2) is connected to the drain pad electrode DRP. The structure of the connection of the bonding ribbon LB1 (or bonding wire WIR1) to the source pad electrode SOP is the same as the structure of the connection of the bonding wire WIR1 to the source interconnect SOI in the third embodiment. In addition, the structure of the connection of the bonding ribbon LB2 (or bonding wire WIR2) to the drain pad electrode DRP is the same as the structure of the connection of the bonding wire WIR2 to the drain interconnect DRI in the third embodiment.

In the present embodiment, the same effect as that in the fourth embodiment is also obtained.

(Sixth Embodiment)

Figure 17:
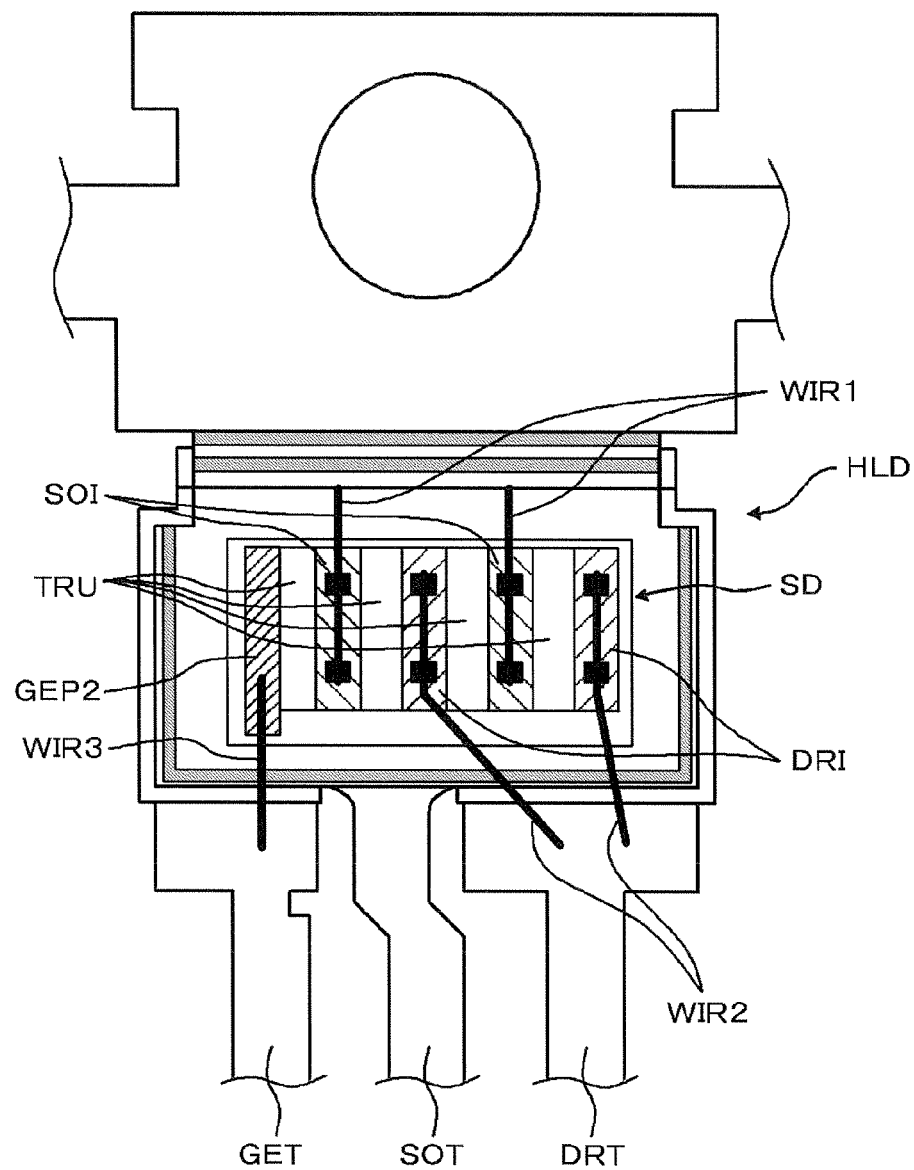
FIG. 17 is a diagram illustrating a configuration of an electronic device according to a sixth embodiment.

FIG. 17 is a diagram illustrating a configuration of an electronic device ED according to a sixth embodiment. The electronic device ED includes a semiconductor device SD. The configuration of the semiconductor device SD is as shown in any of the first to fifth embodiments.

The semiconductor device SD is mounted on a holding member HLD. The holding member HLD is, for example, a lead frame of a semiconductor package, and includes a gate terminal GET, a source terminal SOT, and a drain terminal DRT. The gate terminal GET is connected to the gate pad electrode GEP2 through a bonding wire WIR3 (or bonding ribbon). The source terminal SOT is connected to the source pad electrode SOP through the bonding wire WIR1 (or bonding ribbon LB1), and the drain terminal DRT is connected to the drain pad electrode DRP through the bonding wire WIR2 (or bonding ribbon LB2). In the example shown in the drawing, the source terminal SOT, the drain terminal DRT, and the gate terminal GET are located in the same direction based on the semiconductor device SD. Meanwhile, the semiconductor device SD is mounted on a die pad DP.

Figure 18:
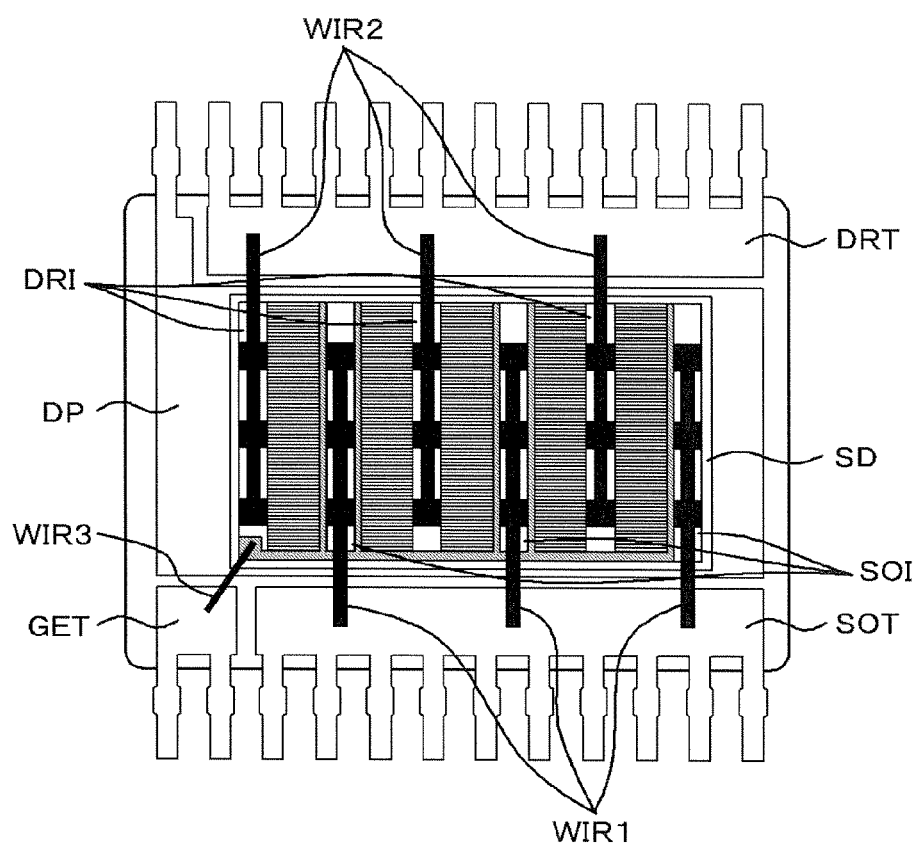
FIG. 18 is a diagram illustrating a modified example of FIG. 17.

However, as shown in FIG. 18, the source terminal SOT and the drain terminal DRT may be located on the opposite sides to each other based on the semiconductor device SD. In this case, it is preferable that the gate terminal GET be located on the same side as the source terminal SOT having a relatively low potential. In this manner, it is possible to suppress the occurrence of dielectric breakdown between the gate terminal GET and other terminals.

In the present embodiment, the same effect as those in any of the first to fifth embodiments is also obtained.

As stated above, while the present invention devised by the inventor has been described specifically on the basis of the embodiments thereof, the present invention is not limited to the above-mentioned embodiments, and it goes without saying that various changes and modifications may be made without departing from the scope of the invention.

It is apparent that the present invention is not limited to the above embodiment, and may be modified and changed without departing from the scope and spirit of the invention.

What is claimed is:

1. A semiconductor device comprising:
    a semiconductor chip of a substantially rectangular shape having a main surface, a rear surface opposite the main surface, a first side, a second side opposite the first side, a substrate, an epitaxial layer formed on the substrate, a source electrode formed on the epitaxial layer, a drain electrode formed on the epitaxial layer and a gate electrode formed on the epitaxial layer,
    the source electrode having a first portion extending in a first direction from the first side to the second side and a second portion extending from the first portion of the source electrode forward a first portion of the drain electrode, the drain electrode having the first portion extending in the first direction and a second portion extending from the first portion of the drain electrode forward the first portion of the source electrode,
the gate electrode arranged between the first portion of the source electrode and the first portion of the drain electrode;
a plurality of lead frames including a source lead which is arranged outside of the semiconductor chip, a drain lead which is arranged outside of the semiconductor chip, a gate lead which is arranged outside of the semiconductor chip and a die pad on which the semiconductor chip is mounted;
a plurality of bonding wires including a first bonding wire via which the source electrode is electrically connected with the source lead, a second bonding wire via which the drain electrode is electrically connected with the drain lead and a third bonding wire via which the gate electrode is electrically connected with the gate lead; and
a resin package sealing the semiconductor chip, a portion of each of the plurality of lead frames and the plurality of bonding wires,
wherein in a plan view, the first portion of the source electrode and the first portion of the drain electrode extend in parallel to each other in the first direction,
wherein in the plan view, the second portion of the source electrode and the second portion of the drain electrode extend in parallel to each other in a second direction that is perpendicular to the first direction,
wherein the first bonding wire is electrically connected with the source electrode at a plurality of bonding points which are arranged in the first direction,
wherein, in cross sectional view, the first bonding wire is spaced apart from the source electrode between adjacent bonding points,
wherein the second bonding wire is electrically connected with the drain electrode at a plurality of bonding points which are arranged in the first direction, and
wherein, in cross sectional view, the second bonding wire is spaced apart from the drain electrode between adjacent bonding points.

2. The semiconductor device according to claim 1, wherein the source lead is located outside of the first side of the semiconductor chip, and wherein the drain lead is located outside of the second side of the semiconductor chip.

3. The semiconductor device according to claim 2,
wherein the gate lead is located outside of the first side of the semiconductor chip,
wherein a gate pad is formed on the epitaxial layer of the semiconductor chip and is located closer to the first side of the semiconductor chip than the second side of the semiconductor chip in the plan view,
wherein the gate pad is electrically connected with the gate electrode, and
wherein the gate pad is electrically connected with the gate lead by the third bonding wiring.

4. The semiconductor device according to claim 1,
wherein an end portion of the second portion of the source electrode is terminated at the vicinity of the first portion of the drain electrode than the first portion of the source electrode, and
wherein an end portion of the second portion of the drain electrode is terminated at the vicinity of the first portion of the source electrode than the first portion of the drain electrode.

5. The semiconductor device according to claim 1,
wherein the source lead has a first portion extending in the second direction and a plurality of second portions extending from the first portion of the source lead forward outside of the resin package, and
wherein an end portion of each of the second portions of the source lead is exposed from the resin package.

6. The semiconductor device according to claim 5,
wherein the drain lead has a first portion extending in the second direction and a plurality of second portions extending from the first portion of the drain lead forward outside of the resin package,
wherein an end portion of each of the second portions of the drain lead is exposed from the resin package.

7. The semiconductor device according to claim 6,
wherein the gate lead has a first portion extending in the second direction and a plurality of second portions extending from the first portion of the gate lead forward outside of the resin package, and
wherein an end portion of each of the second portions of the gate lead is exposed from the resin package.

8. The semiconductor device according to claim 1,
wherein a portion of the gate electrode is arranged between the second portion of the source electrode and the second portion of the drain electrode in the plan view.

9. The semiconductor device according to claim 1, wherein the epitaxial layer includes a buffer layer, a channel layer and a barrier layer.

10. A semiconductor device comprising:
a semiconductor chip of a substantially rectangular shape having a main surface, a rear surface opposite the main surface, a first side, a second side opposite the first side, a substrate, an epitaxial layer formed on the substrate, a first electrode formed on the epitaxial layer, a second electrode formed on the epitaxial layer and a third electrode formed on the epitaxial layer,
the first electrode having a first portion extending in a first direction from the first side to the second side and a second portion extending from the first portion of the first electrode forward a first portion of the second electrode,
the second electrode having the first portion extending in the first direction and a second portion extending from the first portion of the second electrode forward the first portion of the first electrode,
the third electrode arranged between the first potion of the first electrode and the first portion of the second electrode;
a plurality of lead frames including a first lead which is arranged outside of the semiconductor chip, a second lead which is arranged outside of the semiconductor chip, a third lead which is arranged outside of the semiconductor chip and a die pad on which the semiconductor chip is mounted;
a plurality of bonding wires including a first bonding wire via which the first electrode is electrically connected with the first lead, a second bonding wire via which the second electrode is electrically connected with the second lead and a third bonding wire via which the third electrode is electrically connected with the third lead; and
a resin package sealing the semiconductor chip, a portion of each of the plurality of lead frames and the plurality of bonding wires, wherein in a plan view, the first portion of the first electrode and the first portion of the second electrode extend in parallel to each other in the first direction, wherein in the plan view, the second portion of the first electrode and the second portion of the second electrode extend in parallel to each other in a second direction that is perpendicular to the first direction, wherein the first bonding wire is electrically connected with the first lead and the first electrode at a plurality of first bonding points, wherein the plurality of first bonding points include a first point at which the first lead is electrically connected with one end portion of the first bonding wire, a second point at which the first electrode is electrically connected with the other end portion of the first bonding wire, and a third point at which the first electrode is electrically connected with a portion of the first bonding wire between one end portion of the first bonding wire and the other end portion of the first bonding wire, wherein the second and third points are arranged in the first direction and adjacent to each other, wherein a bonding point at which the first electrode is electrically connected with the first bonding wire is not arranged between the second and third points in cross sectional view, wherein the second bonding wire is electrically connected with the second lead and the second electrode at a plurality of second bonding points, wherein the plurality of second bonding points include a fourth point at which the second lead is electrically connected with one end portion of the second bonding wire, a fifth point at which the second electrode is electrically connected with the other end portion of the second bonding wire, and a sixth point at which the second electrode is electrically connected with a portion of the second bonding wire between one end portion of the second bonding wire and the other end portion of the second bonding wire, wherein the fifth and sixth points are arranged in the first direction and are adjacent to each other, and wherein a bonding point at which the second electrode is electrically connected with the second bonding wire is not arranged between the fifth and sixth points in cross sectional view.

11. The semiconductor device according to claim 10, wherein the first lead is located outside of the first side of the semiconductor chip, and wherein the second lead is located outside of the second side of the semiconductor chip.

12. The semiconductor device according to claim 11, wherein the third lead is located outside of the first side of the semiconductor chip, wherein a pad is formed on the epitaxial layer of the semiconductor chip and is located closer to the first side of the semiconductor chip than the second side of the semiconductor chip in the plan view, wherein the pad is electrically connected with the third electrode, and wherein the pad is electrically connected with the third lead by the third bonding wiring.

13. The semiconductor device according to claim 10, wherein an end portion of the second portion of the first electrode is terminated at the vicinity of the first portion of the second electrode than the first portion of the first electrode, and wherein an end portion of the second portion of the second electrode is terminated at the vicinity of the first portion of the first electrode than the first portion of the second electrode.

14. The semiconductor device according to claim 10, wherein the first lead has a first portion extending in the second direction and a plurality of second portions extending from the first portion of the first lead forward outside of the resin package, and wherein an end portion of each of the second portions of the first lead is exposed from the resin package.

15. The semiconductor device according to claim 14, wherein the second lead has a first portion extending in the second direction and a plurality of second portions extending from the first portion of the second lead forward outside of the resin package, and wherein an end portion of each of the second portions of the second lead is exposed from the resin package.

16. The semiconductor device according to claim 15, wherein the third lead has a first portion extending in the second direction and a plurality of second portions extending from the first portion of the third lead forward outside of the resin package, and wherein an end portion of each of the second portions of the third lead is exposed from the resin package.

17. The semiconductor device according to claim 10, wherein a portion of the third electrode is arranged between the second portion of the first electrode and the second portion of the second electrode in the plan view.

18. The semiconductor device according to claim 10, wherein the epitaxial layer includes a buffer layer, a channel layer and a barrier layer.

* * * * *